United States Patent
Lee et al.

(10) Patent No.: US 8,284,562 B2
(45) Date of Patent: Oct. 9, 2012

(54) ELECTRO DEVICE EMBEDDED PRINTED CIRCUIT BOARD AND MANUFACTURING METHOD THEREOF

(75) Inventors: Doo-Hwan Lee, Euijungboo-si (KR); Sang-Jin Baek, Suwon-si (KR); Jin-Soo Jeong, Chungjoo-si (KR); Sang-Chul Lee, Anyang-si (KR); Jong-Yun Lee, Inchun (KR); Jae-Kul Lee, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 234 days.

(21) Appl. No.: 12/877,684

(22) Filed: Sep. 8, 2010

(65) Prior Publication Data

US 2011/0216513 A1 Sep. 8, 2011

(30) Foreign Application Priority Data

Mar. 5, 2010 (KR) ........................ 10-2010-0020113

(51) Int. Cl.
*H05K 1/18* (2006.01)
(52) U.S. Cl. ........ 361/761; 361/763; 361/764; 174/262; 29/837
(58) Field of Classification Search .......... 361/760–766, 361/782, 783, 807, 811; 174/260–266; 29/832, 29/837
See application file for complete search history.

(56) References Cited

U.S. PATENT DOCUMENTS

| | | | | |
|---|---|---|---|---|
| 7,351,915 B2 * | 4/2008 | Ahn et al. | ...................... | 174/260 |
| 7,507,915 B2 * | 3/2009 | Chang et al. | ................... | 174/260 |
| 2004/0150966 A1 * | 8/2004 | Hu | ................................. | 361/763 |
| 2006/0191711 A1 * | 8/2006 | Cho et al. | ....................... | 174/260 |
| 2007/0263369 A1 * | 11/2007 | Takeuchi et al. | .............. | 361/760 |
| 2008/0123308 A1 * | 5/2008 | Ryu et al. | ....................... | 361/762 |
| 2008/0144298 A1 * | 6/2008 | Inagaki et al. | ................ | 361/763 |
| 2009/0073667 A1 * | 3/2009 | Chung et al. | .................. | 361/763 |
| 2010/0142170 A1 * | 6/2010 | Kim et al. | ..................... | 361/762 |

FOREIGN PATENT DOCUMENTS

| | | |
|---|---|---|
| JP | 3-038001 A | 2/1991 |
| JP | 04-130789 | 5/1992 |
| JP | 11-103013 A | 4/1999 |
| JP | 2001-053447 A | 2/2001 |
| JP | 2002-348441 A | 12/2002 |

(Continued)

OTHER PUBLICATIONS

Korean Office Action, with English translation, issued in Korean Patent Application No. 10-2010-0020113, mailed Jun. 15, 2011.
Japanese Office Action, and partial English translation thereof, issued in Japanese Patent Application No. 2010-190877 dated May 8, 2012.

*Primary Examiner* — Hoa C Nguyen
(74) *Attorney, Agent, or Firm* — McDermott Will & Emery LLP (57) ABSTRACT

An electro device embedded printed circuit board and a manufacturing method thereof are disclosed. In accordance with an embodiment of the present invention, a printed circuit board embedded with an electro device, in which a pair of electrodes are formed on either end, includes: a core substrate in which a first cavity is formed; a first passive device embedded in the first cavity and being thinner than the core substrate; and a second passive device stacked on an upper side of the first passive device such that the second passive device is embedded in the first cavity. The first passive device and the second passive device are stacked to cross each other.

12 Claims, 5 Drawing Sheets

FOREIGN PATENT DOCUMENTS

| | | |
|---|---|---|
| JP | 2003-168871 A | 6/2003 |
| JP | 2007-103466 A | 4/2007 |
| JP | 2008-047917 A | 2/2008 |
| KR | 10-2007-0036341 | 4/2007 |
| KR | 10-2007-0101183 | 10/2007 |
| KR | 10-2009-0029574 | 3/2009 |

* cited by examiner

ELECTRO DEVICE EMBEDDED PRINTED CIRCUIT BOARD AND MANUFACTURING METHOD THEREOF

CROSS-REFERENCE TO RELATED APPLICATIONS

This application claims the benefit of Korean Patent Application No. 10-2010-0020113, filed with the Korean Intellectual Property Office on Mar. 5, 2010, the disclosure of which is incorporated herein by reference in its entirety.

BACKGROUND

1. Technical Field

The present invention is related to an electro device embedded printed circuit board and a manufacturing method of the electro device embedded printed circuit board.

2. Description of the Related Art

With the development of the electronic industry, there is a growing demand for a smaller and higher functional electro device. Particularly, the market trend based on lighter, thinner, shorter and smaller personal mobile devices has resulted in increasingly thinner printed circuit boards.

Emerging as a result are ways of mounting an electro device that is different from the conventional mounting methods. One such example is an embedded printed circuit board, in which an active device, such as an IC, or a passive device, such as an MLCC-type capacitor, is mounted inside a printed circuit board, resulting in a higher density and improved reliability of the devices or improved performance of the package itself through an organic combination.

In the embedded printed circuit board, an opening (cavity), into which an electro device is inserted, is formed in a pre-fabricated core substrate, and then the electro device is embedded at a corresponding location. Then, the embedded device is fixed by filling an insulation material between the embedded device and the core substrate.

Recently, there has been an increasing requirement for maximizing the efficiency of size by embedding a plurality of devices, and studies are in demand for addressing such requirement.

SUMMARY

The present invention provides an electro device embedded printed circuit board and a manufacturing method of the electro device embedded printed circuit board that can efficiently embed a plurality of electro devices in one board.

An aspect of the present invention features a printed circuit board embedded with an electro device, in which a pair of electrodes are formed on either end. The electro device embedded printed circuit board in accordance with an embodiment of the present invention can include: a core substrate in which a first cavity is formed; a first passive device embedded in the first cavity and being thinner than the core substrate; and a second passive device stacked on an upper side of the first passive device such that the second passive device is embedded in the first cavity. The first passive device and the second passive device can be stacked to cross each other.

The electro device embedded printed circuit board can also include: a first insulation layer stacked on an upper surface of the core substrate; a second insulation layer stacked on a lower surface of the core substrate; a circuit pattern patterned on the first insulation layer and the second insulation layer; and a blind via directly connecting the circuit pattern and electrodes of the first passive device.

The electro device embedded printed circuit board can also include: a second cavity formed on the core substrate; and a third passive device embedded in the second cavity and having a thickness corresponding to a thickness of the core substrate.

The electro device embedded printed circuit board can also include: a third cavity formed on the core substrate; and a fourth passive device vertically embedded in the third cavity such that electrodes formed on either end of the fourth passive device are arranged above and below each other.

The electro device embedded printed circuit board can also include: a fourth cavity formed on the core substrate; and an active device embedded in the fourth cavity and having a thickness corresponding to a thickness of the core substrate.

Another aspect of the present invention features a method of manufacturing a printed circuit board embedded with an electro device, in which a pair of electrodes are formed on either end. The method of manufacturing an electro device embedded printed circuit board in accordance with an embodiment of the present invention can include: perforating a first cavity in a core substrate; adhering a supporting film on a lower surface of the core substrate; embedding a first passive device in the first cavity, the first passive device being thinner than the core substrate; and stacking a second passive device on an upper side of the first passive device such that the second passive device is embedded in the first cavity. The first passive device and the second passive device can be stacked to cross each other.

The method can also include: stacking a first insulation layer on an upper surface of the core substrate; removing the supporting film; stacking a second insulation layer on a lower surface of the core substrate; and forming a circuit pattern and a blind via on the first insulation layer and the second insulation layer.

The method can also include: perforating a second cavity in the core substrate, prior to the adhering of the supporting film; and embedding a third passive device, which has a thickness corresponding to a thickness of the core substrate, in the second cavity, after the adhering of the supporting film.

The method can also include: perforating a third cavity in the core substrate, prior to the adhering of the supporting film; and embedding a fourth passive device in the third cavity such that electrodes formed on either end of the fourth passive device are arranged above and below each other, prior to the adhering of the supporting film.

The method can also include: perforating a fourth cavity in the core substrate, prior to the adhering of the supporting film; and embedding an active device, which has a thickness corresponding to a thickness of the core substrate, in the fourth cavity, after the adhering of the supporting film.

Additional aspects and advantages of the present invention will be set forth in part in the description which follows, and in part will be obvious from the description, or may be learned by practice of the invention.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a device or combinations thereof, and shall not be construed to preclude any presence or possibility of one or more other characteristics, numbers, steps, operations, elements, devices or combinations thereof.

Hereinafter, some embodiments of an electro device embedded printed circuit board and a manufacturing method thereof will be described in detail with reference to the accompanying drawings. Identical or corresponding elements will be given the same reference numerals, regardless of the figure number, and any redundant description of the identical or corresponding elements will not be repeated.

Figure 1:
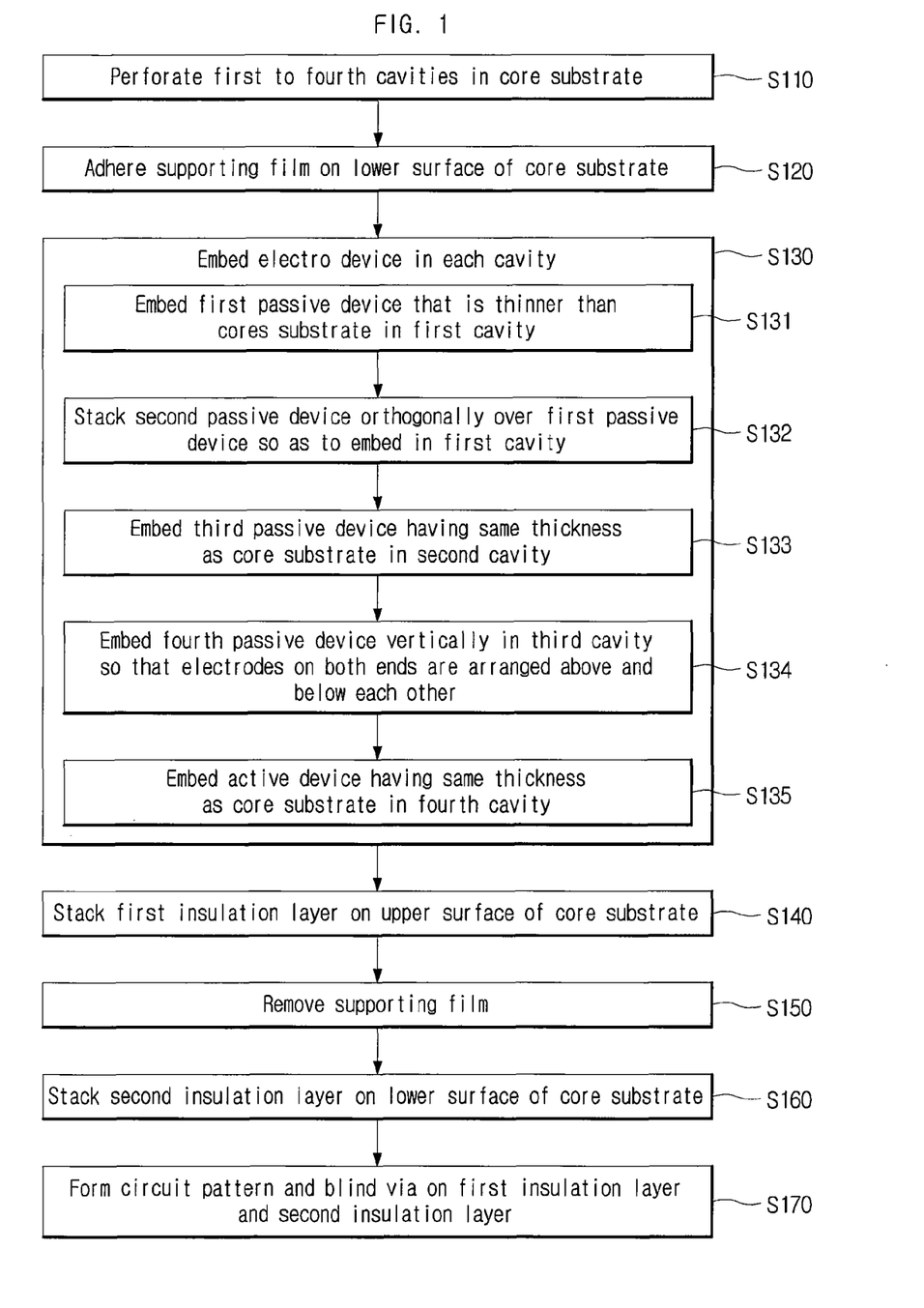
FIG. 1 is a flow diagram illustrating a method of manufacturing an electro device embedded printed circuit board in accordance with an aspect of the present invention.

First, a method of manufacturing an electro device embedded printed circuit board in accordance with an aspect of the present invention will be described with reference to FIGS. 1 to 11. FIG. 1 is a flow diagram illustrating a method of manufacturing an electro device embedded printed circuit board in accordance with an aspect of the present invention, and FIG. 2 to FIG. 11 illustrate each process of manufacturing an electro device embedded printed circuit board in accordance with an aspect of the present invention. Illustrated in FIGS. 2 to 11 are a core substrate 10, cavities 11, 12, 13, 14, a circuit pattern 15, a supporting film 20, a first passive device 30, an adhesive layer 35, a second passive device 40, a third passive device 50, a fourth passive device 60 and an active device 70.

Figure 2:
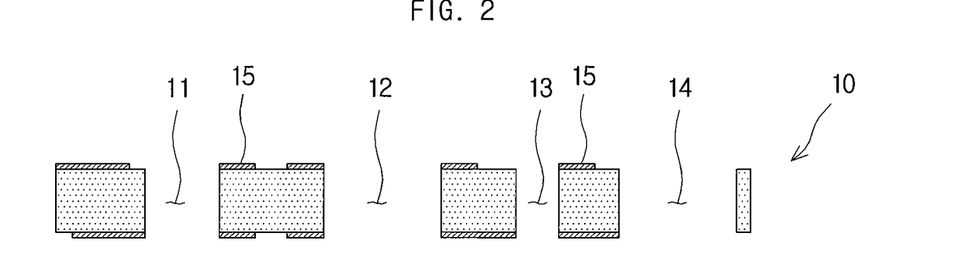
FIG. 2 to FIG. 11 illustrate each process of manufacturing an electro device embedded printed circuit board in accordance with an aspect of the present invention.

As illustrated in FIG. 2, the cavities 11, 12, 13, 14 are first perforated in the core substrate 10 (S110). The cavities 11, 12, 13, 14, which provide space for embedding electro devices in the core substrate 10, can be formed by, for example, drilling the core substrate 10. Although the present embodiment presents a case of forming four cavities 11, 12, 13, 14, it shall be appreciated that the present invention is not restricted to this and that the number of cavities can be changed according to the number of electro devices embedded in the core substrate 10.

The core substrate 10 can be an insulation board in which a reinforcing material such as glass fiber or carbon fiber is impregnated in an insulation resin. In this case, the warpage of the core substrate 10 can be reduced, and thus the product reliability can be improved. However, it shall be appreciated that the present invention is not restricted to what is described in this embodiment and that the material for the core substrate 10 can be variously changed. For example, a metal core made of a metallic material can be used for the core substrate 10.

Figure 3:
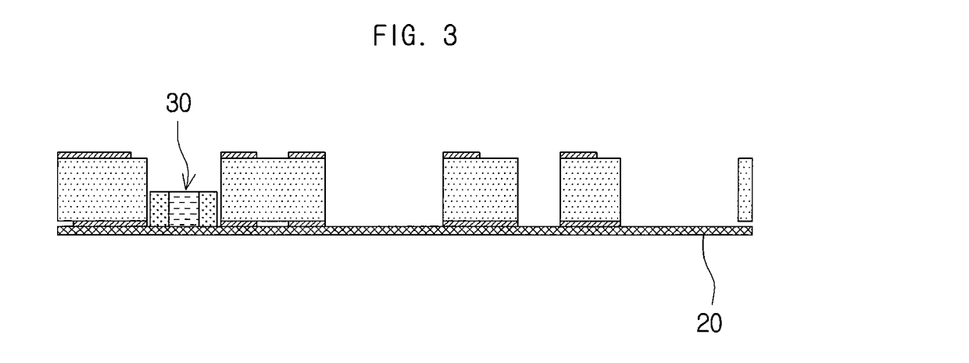

Next, as illustrated in FIG. 3, the supporting film 20 is adhered to a lower surface of the core substrate 10 (S120). Once the supporting film 20 is adhered to the lower surface of the core substrate 10, lower sides of the cavities 11, 12, 13, 14 are closed by the supporting film 20.

Figure 4:
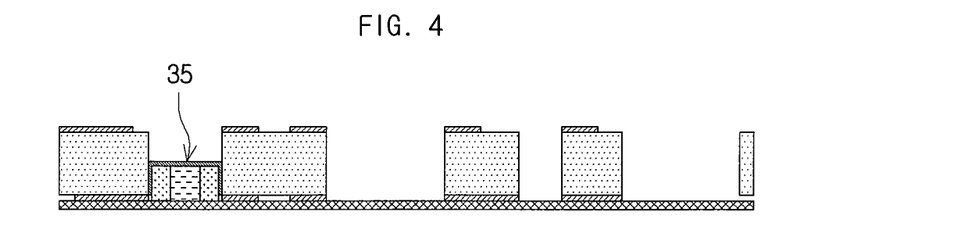
Figure 5:
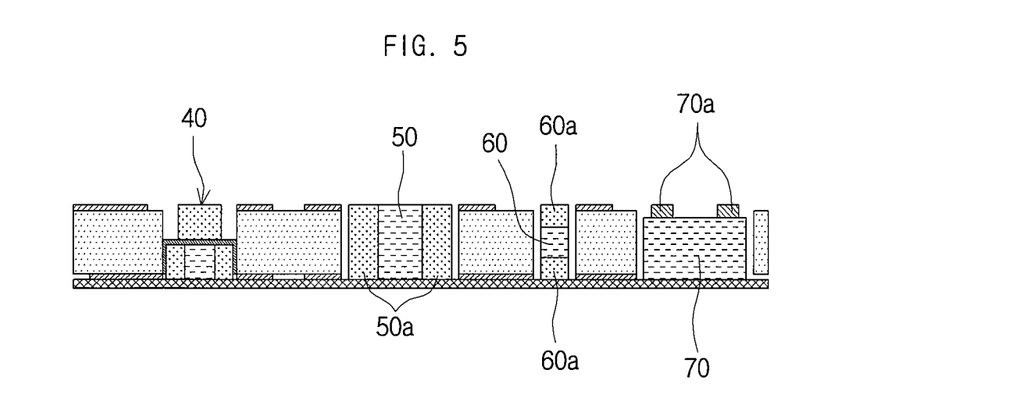
Figure 6:
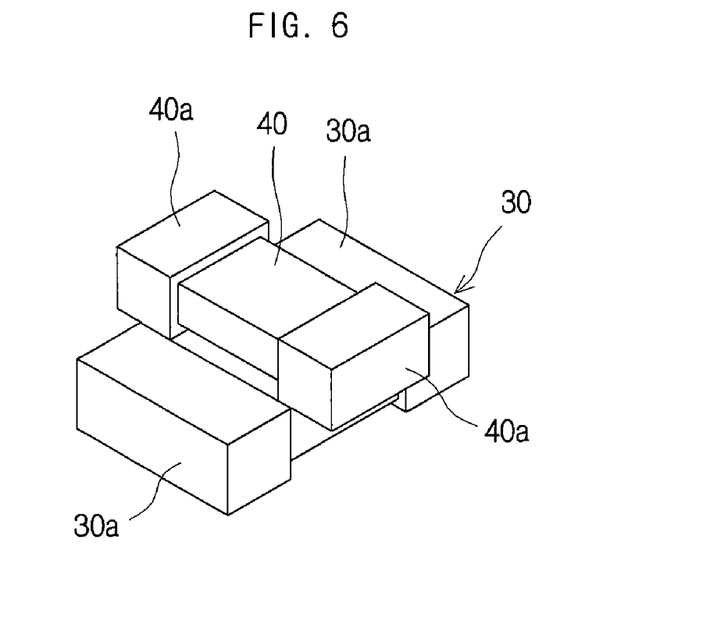

Then, as illustrated in FIGS. 3 to 5, an electro device is embedded in each of the cavities 11, 12, 13, 14 (S130). This will be described below in further detail.

First, as illustrated in FIG. 3, the first passive device 30 that is thinner than the core substrate 10 is embedded in a first cavity 11 (S131). The passive devices 30, 40, 50, 60 used in this embodiment are structured to have a pair of electrodes 30a, 40a, 50a, 60a on either end thereof. That is, the passive devices 30, 40, 50, 60 are shaped like a dumbbell.

Once the first passive device 30 shaped like a dumbbell is embedded in the first cavity 11, the passive device 30 is seated in and fixed by the supporting film 20. Here, since the first passive device 30 is thinner than the core substrate 10, there still is space left on an upper side of the first passive device 30 inside the first cavity 11.

Then, as illustrated in FIG. 4, the adhesive layer 35 is formed on the upper side of the first passive device 30, and then the second passive device 40 is stacked on the upper side of and across the first passive device 30 (S132). That is, the first passive device 30 and the second passive device 40 are stacked in a cross style.

Figure 7:
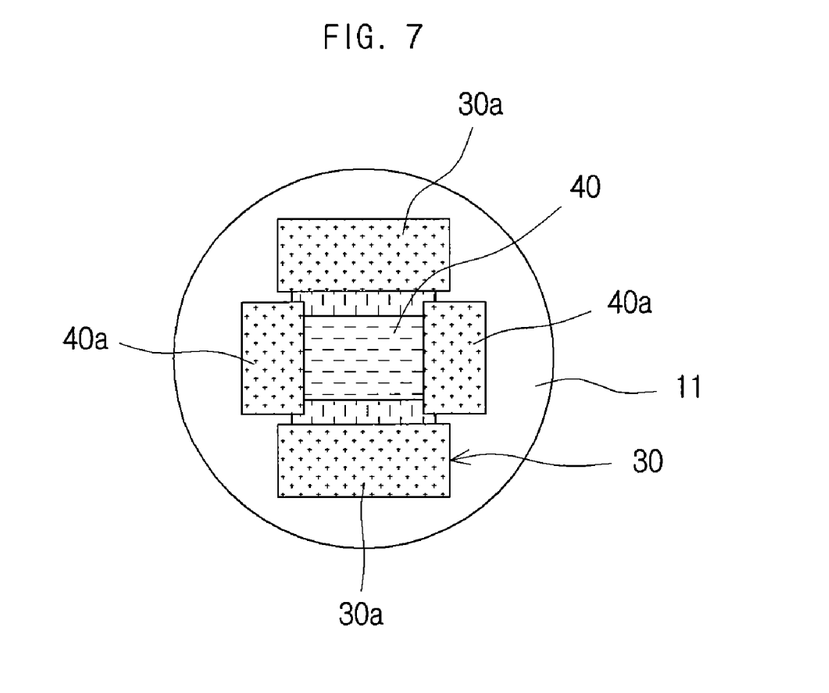

As described earlier, the first passive device 30 and the second passive device 40 have the electrodes 30a, 40a formed on both ends thereof. Therefore, by stacking the first passive device 30 and the second passive device 40 to cross each other, there is a less chance that the electrodes 30a, 40a of the first passive device 30 and the second passive device 40 short-circuit each other, thereby improving the product reliability. Here, in order to provide ample space for the passive devices 30, 40 that are stacked to cross each other, the first cavity 11 can be formed in a circular shape, as illustrated in FIG. 7. FIG. 7 is a plan view illustrating the first cavity 11, in which the first passive device 30 and the second passive device 40 are embedded.

In addition, since a plurality of passive devices 30, 40 can be embedded in one cavity 11, the degree of integration in a product can be improved.

Here, the first passive device 30 and the second passive device 40 can have different sizes from each other. For example, if the core substrate 10 having the first cavity 11 perforated therein has the thickness of 550 um (including the thickness of the circuit pattern 15 formed on the surface), the passive device 40 having the thickness of 200 um can be stacked over the first passive device 30 having the thickness of 300 um. In this case, by forming the adhesive layer 35 in the thickness of 50 um, the thickness of the stacked passive devices 30, 40 and the thickness of the core substrate 10 can be made the same, and as a result, the warpage of the core substrate 10 can be improved.

Separately from the above-described first passive device 30 and second passive device 40, the third passive device 50 having a thickness corresponding to the thickness of the core substrate 10 can be embedded in a second cavity 12 (S133), as shown in FIG. 5. That is, apart from the first and second passive devices 30, 40 having relatively small sizes, the third passive device 50 having a bigger size can be embedded in one core substrate 10. Through this, it becomes possible to maximally embed a plurality of different parts in one core substrate 10. Here, by making the thicknesses of the third passive device 50 and the core substrate 10 identical or substantially identical, the warpage property of the core substrate 10 can be improved.

As illustrated in FIG. 5, the fourth passive device 60 can be vertically embedded in a third cavity 13 such that the electrodes 60a formed on both ends can be arranged above and below each other (S134). In case it is desired to embed an additional fourth passive device 60 that is thinner than the core substrate 10, as in the case of the first and second passive devices 30, 40, the additional fourth passive device 60 can be embedded vertically such that the electrodes 60a are arranged above and below each other.

In addition, as illustrated in FIG. 5, the active device 70 having a thickness corresponding to the thickness of the core substrate 10 can be embedded in a fourth cavity 14 (S135). Although FIG. 5 illustrates that electrodes 70a of the active device 70 face upwards, it shall be appreciated that the electrodes 70a can face downwards according to design requirements.

According to the above method of embedding electro devices, various sizes and/or types of electro devices 30, 40, 50, 60, 70 can be maximally embedded in a single core substrate 10, helping to improve the degree of integration in a product. Moreover, as described earlier, the number of cavities formed in the core substrate 10 and the types and forms of the electro devices embedded in the formed cavities can be variably changed.

Figure 8:
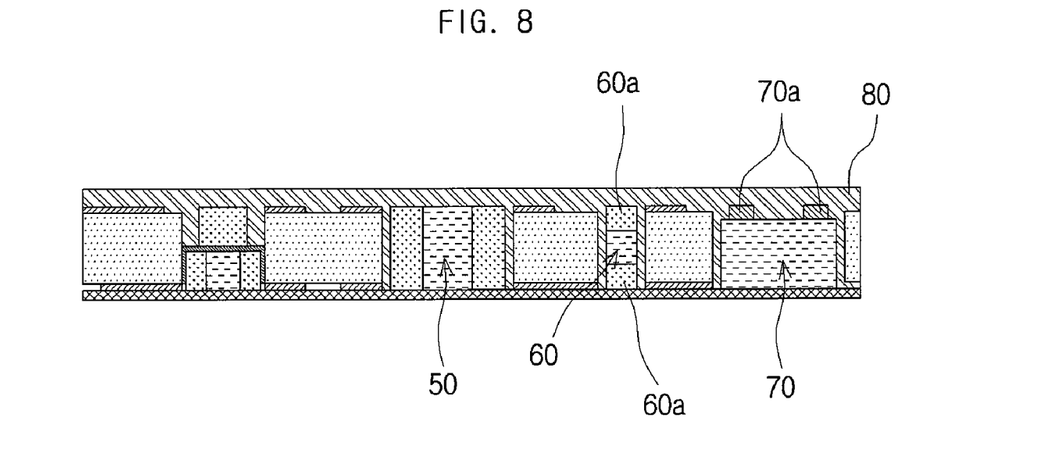
Figure 9:
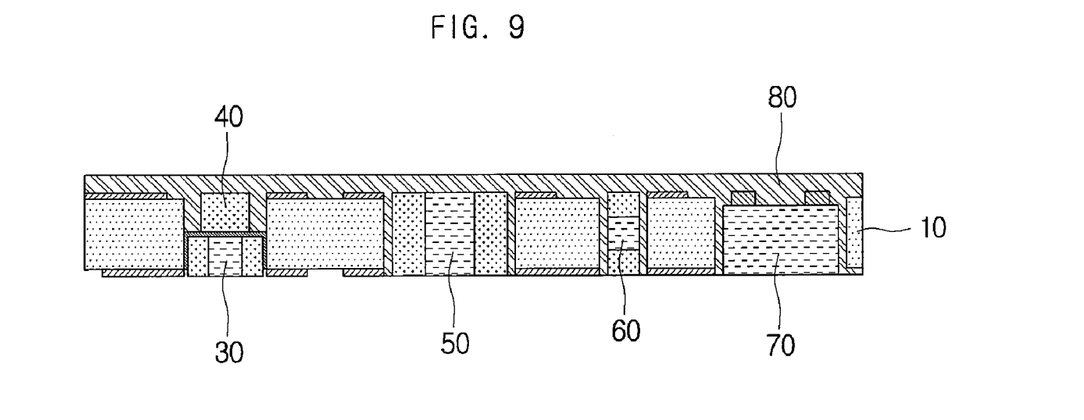
Figure 10:
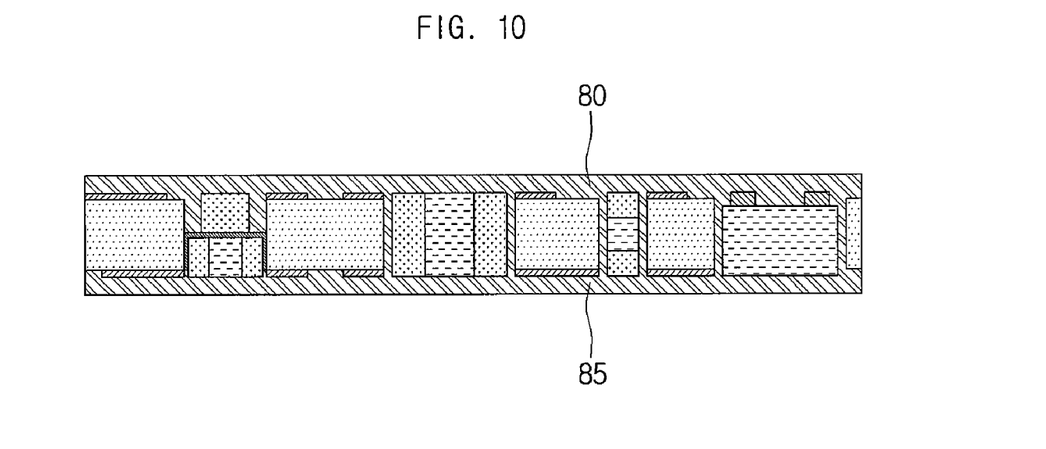

After embedding the electro devices 30, 40, 50, 60, 70 in the cavities as described above, a first insulation layer 80 is stacked on an upper surface of the core substrate 10 as illustrated in FIG. 8 (S140), and then the supporting film 20 is removed as illustrated in FIG. 9 (S150). Then, as illustrated in FIG. 10, a second insulation layer 85 is stacked on a lower surface of the core substrate 10 (S160).

Figure 11:
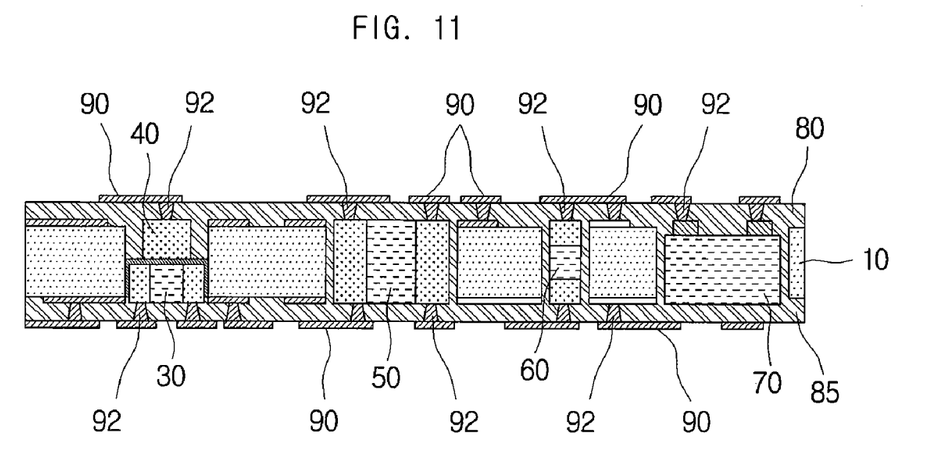

Then, as illustrated in FIG. 11, a circuit pattern 90 and blind vias 92 are formed on the first insulation layer 80 and the second insulation layer 85 (S170). The blind vias 92 formed on the first insulation layer 80 and the second insulation layer 85 connect the electrodes 30a, 40a, 50a, 60a, 70a of the electro devices with the circuit pattern 90 directly. By having the blind vias 92 directly access the electrodes 30a, 40a, 50a, 60a, 70a, no additional process for re-wiring is required, and the signal transfer paths can be minimized, thereby improving the performance of the product.

Hereinafter, the structure of an electro device embedded printed circuit board in accordance with another aspect of the present invention will be described. As the electro device embedded printed circuit board in accordance with another aspect of the present invention can be manufactured by the same or similar manufacturing method described above, any redundant description will be omitted.

The electro device embedded printed circuit board in accordance with an embodiment of the present invention includes a core substrate 10 in which a first cavity 11 is formed, a first passive device 30 that is thinner than the cores substrate 10 and embedded in the first cavity 11, and a second passive device 40 stacked on an upper side of the first passive device 30 so as to be embedded in the first cavity 11. Here, the first passive device 30 and the second passive device 40 are stacked to cross each other. That is, the first passive device 30 and the second passive device 40 are stacked in a cross style.

Through this structure, electrodes 30a, 40a of the first passive device 30 and the second passive device 40 have a less chance of short-circuiting each other, thereby improving the product reliability. Moreover, since a plurality of electro devices 30, 40 can be embedded in one cavity 11, the degree of integration in a product can be improved, as described earlier.

A first insulation layer 80 can be stacked on an upper surface of the core substrate 10, and a second insulation layer 85 can be stacked on a lower surface of the core substrate 10. Here, a circuit pattern 90 can be formed on the first insulation layer 80 and the second insulation layer 85, and the circuit pattern and electrodes 30a, 40a of the passive devices can be directly connected to one another by blind vias 92. By having the blind vias 92 directly access the electrodes 30a, 40a, no additional process for re-wiring is required, and the signal transfer paths can be minimized, thereby improving the performance of the product.

As described earlier, a third passive device 50, having a thickness corresponding to the thickness of the core substrate 10, can be embedded in a second cavity 12, which is formed in addition to the first cavity 11.

Moreover, a fourth passive device 60 can be vertically embedded in a third cavity 13. In this case, electrodes 60a formed on either end of the fourth passive device 60 are arranged above and below each other.

Additionally, as described earlier, an active device 70, having a thickness corresponding to the thickness of the core substrate 10, can be embedded in a fourth cavity 14.

Hitherto, some embodiments of the present invention have been described. However, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. An electro device embedded printed circuit board, the electro device having a pair of electrodes formed on either end thereof, the electro device embedded printed circuit board comprising:
    a core substrate in which a first cavity is formed;
    a first passive device embedded in the first cavity, the first passive device being thinner than the core substrate; and
    a second passive device stacked on an upper side of the first passive device such that the second passive device is embedded in the first cavity,
    wherein the first passive device and the second passive device are stacked to cross each other.

2. The electro device embedded printed circuit board of claim 1, wherein the first passive device and the second passive device have different sizes from each other.

3. The electro device embedded printed circuit board of claim 1, further comprising:
    a first insulation layer stacked on an upper surface of the core substrate;
    a second insulation layer stacked on a lower surface of the core substrate;
    a circuit pattern patterned on the first insulation layer and the second insulation layer; and
    a blind via directly connecting the circuit pattern and electrodes of the first passive device.

4. The electro device embedded printed circuit board of claim 1, further comprising:
    a second cavity formed on the core substrate; and
    a third passive device embedded in the second cavity, the third passive device having a thickness corresponding to a thickness of the core substrate.

5. The electro device embedded printed circuit board of claim 1, further comprising:
   a third cavity formed on the core substrate; and
   a fourth passive device vertically embedded in the third cavity such that electrodes formed on either end of the fourth passive device are arranged above and below each other.

6. The electro device embedded printed circuit board of claim 1, further comprising:
   a fourth cavity formed on the core substrate; and
   an active device embedded in the fourth cavity and having a thickness corresponding to a thickness of the core substrate.

7. A method of manufacturing an electro device embedded printed circuit board, the electro device having a pair of electrodes formed on either end thereof, the method comprising:
   perforating a first cavity in a core substrate;
   adhering a supporting film on a lower surface of the core substrate;
   embedding a first passive device in the first cavity, the first passive device being thinner than the core substrate; and
   stacking a second passive device on an upper side of the first passive device such that the second passive device is embedded in the first cavity,
   wherein the first passive device and the second passive device are stacked to cross each other.

8. The method of claim 7, wherein the first passive device and the second passive device have different sizes from each other.

9. The method of claim 7, further comprising:
   stacking a first insulation layer on an upper surface of the core substrate;
   removing the supporting film;
   stacking a second insulation layer on a lower surface of the core substrate; and
   forming a circuit pattern and a blind via on the first insulation layer and the second insulation layer.

10. The method of claim 7, further comprising:
    perforating a second cavity in the core substrate, prior to the adhering of the supporting film; and
    embedding a third passive device in the second cavity, the third passive device having a thickness corresponding to a thickness of the core substrate, after the adhering of the supporting film.

11. The method of claim 7, further comprising:
    perforating a third cavity in the core substrate, prior to the adhering of the supporting film; and
    embedding a fourth passive device in the third cavity such that electrodes formed on either end of the fourth passive device are arranged above and below each other, prior to the adhering of the supporting film.

12. The method of claim 7, further comprising:
    perforating a fourth cavity in the core substrate, prior to the adhering of the supporting film; and
    embedding an active device in the fourth cavity, the active device having a thickness corresponding to a thickness of the core substrate, after the adhering of the supporting film.

* * * * *